United States Patent
Arat et al.

(10) Patent No.: US 7,504,840 B2
(45) Date of Patent: Mar. 17, 2009

(54) ELECTROCHEMICALLY FABRICATED MICROPROBES

(75) Inventors: Vacit Arat, La Canada Flintridge, CA (US); Adam L. Cohen, Los Angeles, CA (US); Dennis R. Smalley, Newhall, CA (US); Ezekiel J. J. Kruglick, San Diego, CA (US); Richard T. Chen, Burbank, CA (US); Kieun Kim, Pasadena, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 11/244,817

(22) Filed: Oct. 6, 2005

(65) Prior Publication Data

US 2006/0109016 A1    May 25, 2006

Related U.S. Application Data

(63) Continuation of application No. 10/772,943, filed on Feb. 4, 2004, now abandoned.

(60) Provisional application No. 60/536,865, filed on Jan. 15, 2004, provisional application No. 60/533,933, filed on Dec. 31, 2003, provisional application No. 60/506,015, filed on Sep. 24, 2003, provisional application No. 60/445,186, filed on Feb. 4, 2003.

(51) Int. Cl.
   *G01R 31/02* (2006.01)
(52) U.S. Cl. ........................... 324/754; 324/762
(58) Field of Classification Search .................... None
   See application file for complete search history.

(56) References Cited

U.S. PATENT DOCUMENTS

| 4,773,877 | A | | 9/1988 | Kruger et al. | 439/482 |
|---|---|---|---|---|---|
| 4,961,052 | A | | 10/1990 | Gierer | 324/158 |
| 5,017,738 | A | | 5/1991 | Tsuji et al. | 174/94 R |
| 5,070,297 | A | | 12/1991 | Kwon et al. | 324/158 |
| 5,128,612 | A | * | 7/1992 | Aton et al. | 324/754 |
| 5,173,055 | A | * | 12/1992 | Grabbe | 439/66 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Minh N Tang
(74) *Attorney, Agent, or Firm*—Dennis R. Smalley

(57) ABSTRACT

Multilayer test probe structures are electrochemically fabricated via depositions of one or more materials in a plurality of overlaying and adhered layers. In some embodiments each probe structure may include a plurality of contact arms or contact tips that are used for contacting a specific pad or plurality of pads wherein the arms and/or tips are configured in such away so as to provide a scrubbing motion (e.g. a motion perpendicular to a primary relative movement motion between a probe carrier and the IC) as the probe element or array is made to contact an IC, or the like, and particularly when the motion between the probe or probes and the IC occurs primarily in a direction that is perpendicular to a plane of a surface of the IC. In some embodiments arrays of multiple probes are provided and even formed in desired relative position simultaneously.

31 Claims, 19 Drawing Sheets

U.S. PATENT DOCUMENTS

| | | | | |
|---|---|---|---|---|
| 5,177,438 | A | * | 1/1993 | Littlebury et al. ............ 324/754 |
| 5,190,637 | A | | 3/1993 | Guckel ........................ 205/118 |
| 5,297,967 | A | | 3/1994 | Baumberger et al. .......... 439/66 |
| 5,366,380 | A | | 11/1994 | Reymond ..................... 439/66 |
| 5,476,211 | A | | 12/1995 | Khandros ................. 228/180.8 |
| 5,513,430 | A | * | 5/1996 | Yanof et al. .................... 29/846 |
| 5,772,451 | A | | 6/1998 | Dozier et al. .................. 439/70 |
| 5,806,181 | A | | 9/1998 | Khandros et al. ............. 29/874 |
| 5,820,014 | A | | 10/1998 | Dozier et al. .............. 228/56.3 |
| 5,829,128 | A | | 11/1998 | Eldridge et al. ............... 29/855 |
| 5,917,707 | A | | 6/1999 | Khandros et al. ........... 361/776 |
| 5,974,662 | A | | 11/1999 | Eldridge et al. ............... 29/842 |
| 5,994,152 | A | | 11/1999 | Khandros et al. ............. 29/842 |
| 6,023,103 | A | | 2/2000 | Chang et al. ................. 257/781 |
| 6,027,630 | A | | 2/2000 | Cohen ........................ 205/135 |
| 6,043,563 | A | | 3/2000 | Eldridge et al. ............. 257/784 |
| 6,064,213 | A | | 5/2000 | Khandros et al. ........... 324/754 |
| 6,184,053 | B1 | | 2/2001 | Eldridge et al. ............... 438/52 |
| 6,208,225 | B1 | | 3/2001 | Miller ........................ 333/202 |
| 6,218,910 | B1 | | 4/2001 | Miller ......................... 333/33 |
| 6,250,933 | B1 | * | 6/2001 | Khoury et al. ................. 439/66 |
| 6,255,126 | B1 | * | 7/2001 | Mathieu et al. ............... 438/15 |
| 6,268,015 | B1 | | 7/2001 | Mathieu et al. ............... 427/96 |
| 6,293,808 | B1 | * | 9/2001 | Ochiai ......................... 439/70 |
| 6,336,269 | B1 | | 1/2002 | Eldridge et al. ............... 29/885 |
| 6,351,133 | B1 | * | 2/2002 | Jones et al. .................. 324/754 |
| 6,441,315 | B1 | | 8/2002 | Eldridge et al. ............. 174/260 |
| 6,456,099 | B1 | | 9/2002 | Eldridge et al. ............. 324/754 |
| 6,471,524 | B1 | | 10/2002 | Nakano et al. ................. 439/70 |
| 6,482,013 | B2 | | 11/2002 | Eldridge et al. ............... 439/66 |
| 6,483,328 | B1 | | 11/2002 | Eldridge et al. ............. 324/754 |
| 6,509,751 | B1 | | 1/2003 | Mathieu et al. ............. 324/754 |
| 6,520,778 | B1 | | 2/2003 | Eldridge et al. ............... 439/66 |
| 6,539,531 | B2 | | 3/2003 | Miller et al. .................... 716/15 |
| 6,627,483 | B2 | | 9/2003 | Ondricek et al. ............ 438/117 |
| 6,627,980 | B2 | | 9/2003 | Eldridge ..................... 257/678 |
| 6,640,415 | B2 | | 11/2003 | Eslamy et al. ................. 29/593 |
| 6,672,875 | B1 | | 1/2004 | Mathieu et al. ............... 439/66 |
| 6,690,185 | B1 | | 2/2004 | Khandros et al. ........... 324/758 |
| 6,705,876 | B2 | | 3/2004 | Eldridge ....................... 439/66 |
| 6,713,374 | B2 | | 3/2004 | Eldridge et al. ............. 438/611 |
| 6,729,019 | B2 | | 5/2004 | Grube et al. ................... 29/830 |
| 6,783,648 | B1 | | 8/2004 | Anderson et al. ............. 606/28 |
| 6,790,377 | B1 | | 9/2004 | Cohen ........................ 216/94 |
| 6,811,406 | B2 | * | 11/2004 | Grube ......................... 439/66 |
| 6,817,052 | B2 | | 11/2004 | Grube ............................. 15/3 |
| 6,827,584 | B2 | | 12/2004 | Mathieu et al. ............... 439/66 |
| 6,838,893 | B2 | | 1/2005 | Khandros, Jr. et al. ...... 324/754 |
| 6,849,170 | B2 | | 2/2005 | Jerominek et al. ........... 205/71 |
| 7,047,638 | B2 | | 5/2006 | Eldridge et al. ............... 29/884 |
| 7,160,429 | B2 | | 1/2007 | Cohen et al. ................. 205/220 |
| 2003/0127335 | A1 | | 7/2003 | Cohen et al. ................. 205/118 |
| 2003/0127336 | A1 | | 7/2003 | Cohen et al. ................. 205/118 |
| 2003/0221968 | A1 | | 12/2003 | Cohen et al. ................. 205/118 |
| 2003/0222738 | A1 | | 12/2003 | Brown et al. ................. 333/160 |
| 2003/0234179 | A1 | | 12/2003 | Bang ......................... 205/118 |
| 2004/0000489 | A1 | | 1/2004 | Zhang et al. ................. 205/118 |
| 2004/0004001 | A1 | | 1/2004 | Cohen et al. ................. 205/118 |
| 2004/0004002 | A1 | | 1/2004 | Thompson et al. .......... 205/118 |
| 2004/0007468 | A1 | | 1/2004 | Cohen et al. ................. 205/118 |
| 2004/0007470 | A1 | | 1/2004 | Smalley ...................... 205/118 |
| 2004/0020782 | A1 | | 2/2004 | Cohen et al. ................. 205/220 |
| 2004/0065550 | A1 | | 4/2004 | Zhang ........................ 205/135 |
| 2004/0065555 | A1 | | 4/2004 | Zhang ........................ 205/118 |
| 2004/0134772 | A1 | | 7/2004 | Cohen et al. ........... 204/297.06 |
| 2004/0134788 | A1 | | 7/2004 | Cohen et al. ................. 205/118 |
| 2004/0140862 | A1 | | 7/2004 | Brown et al. ................. 333/156 |
| 2004/0146650 | A1 | | 7/2004 | Lockard et al. ............. 427/446 |
| 2004/0147124 | A1 | | 7/2004 | Cohen et al. ................. 205/118 |
| 2004/0182716 | A1 | | 9/2004 | Cohen et al. ................... 218/54 |
| 2004/0251142 | A1 | | 12/2004 | Cohen et al. ................. 205/118 |
| 2005/0029225 | A1 | | 2/2005 | Zhang ........................ 216/40 |
| 2005/0032362 | A1 | | 2/2005 | Cohen et al. ................. 438/697 |
| 2005/0032375 | A1 | | 2/2005 | Lockard et al. ............... 216/41 |
| 2005/0045585 | A1 | | 3/2005 | Zhang et al. ................. 216/58 |
| 2005/0067292 | A1 | | 3/2005 | Thompson et al. .......... 205/118 |
| 2005/0072681 | A1 | | 4/2005 | Cohen et al. ................. 205/118 |
| 2005/0104809 | A1 | | 5/2005 | Arat et al. .................... 324/754 |
| 2005/0142739 | A1 | | 6/2005 | Kumar et al. ............... 438/254 |
| 2005/0142846 | A1 | | 6/2005 | Frodis et al. ................. 438/622 |
| 2005/0179458 | A1 | | 8/2005 | Chen et al. .................. 324/762 |
| 2005/0184748 | A1 | | 8/2005 | Chen et al. .................. 324/761 |
| 2005/0215023 | A1 | | 9/2005 | Cohen et al. ................. 438/381 |
| 2005/0221644 | A1 | | 10/2005 | Kim et al. ..................... 439/81 |
| 2005/0230261 | A1 | | 10/2005 | Cohen et al. ................. 205/118 |
| 2006/0006885 | A1 | | 1/2006 | Kruglick et al. ............. 324/754 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

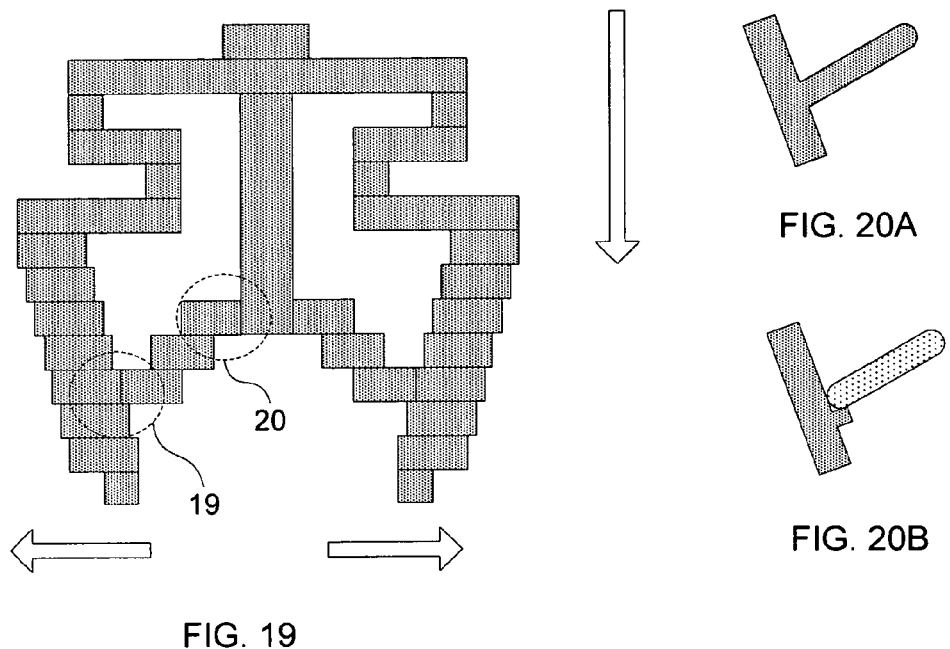
FIG. 19
FIG. 20A
FIG. 20B
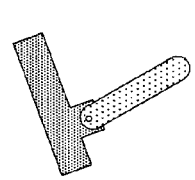
FIG. 20C
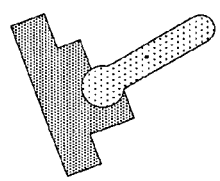
FIG. 20D
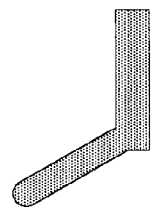
FIG. 21A
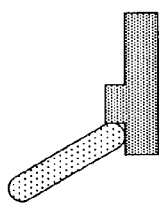
FIG. 21B
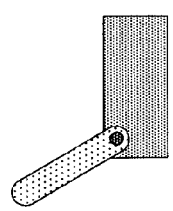
FIG. 21C
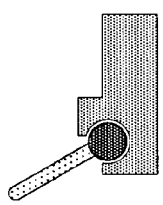
FIG. 21D

US 7,504,840 B2

ELECTROCHEMICALLY FABRICATED MICROPROBES

RELATED APPLICATIONS

This application is a continuation of U.S. Patent Application Ser. No. 10/772,943, now abandoned, filed Feb. 4, 2004 which in turn claims benefit of U.S. Provisional Patent Application Nos.: 60/445,186; 60/506,015; 60/533,933, and 60/536,865 filed on Feb. 4, 2003; Sep. 24, 2003; Dec. 31, 2003, and Jan. 15, 2004 respectively. All of these applications, including any appendices attached thereto are incorporated herein by reference as if set forth in full herein.

FIELD OF THE INVENTION

The present invention relates generally to microprobes and electrochemical fabrication processes (e.g. EFAB® fabrication processes) for making them and more particularly to microprobe designs.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-EI-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, and/or more independence between geometric configuration and the selected fabrication process. A need also exists in the field of miniature (i.e. mesoscale and microscale) device fabrication for improved fabrication methods and apparatus.

SUMMARY OF THE INVENTION

Objects and advantages of various aspects of the invention will be apparent to those of skill in the art upon review of the teachings herein. The various aspects of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single aspect of the invention even though that may be the case with regard to some aspects.

In a first aspect of the invention, a probe device for testing integrated circuits, including: a bridging element; a plurality of contact arms, each having a first end and a second end, where the second end of each connects to the bridging element and the first end of each is configured to contact a pad of an integrated circuit and wherein the arms are configured to scrub the surface of the pad as contact between the probe and the pad is made.

In a second aspect of the invention, a probe device for testing integrated circuits, including: a bridging element; a plurality of contact arms, each having a first end and a second end, where the second end of each connects to the bridging element and the first end of each is configured to contact a pad of an integrated circuit and wherein at least one of the arms or the bridging element is configured to provide compliance between the probe and the pad as contact is made.

In a third aspect of the invention, a probe device for testing integrated circuits, including: a compliant structure; a bridging element adhered to a compliant structure; a plurality of contact arms, each having a first end and a second end, where the second end of each connects to the bridging element and the first end of each is configured to contact a pad of an integrated circuit and wherein at least one of the arms or the bridging element is configured to provide compliance between the probe and the pad as contact is made.

Further aspects of the invention will be understood by those of skill in the art upon reviewing the teachings herein. Other aspects of the invention may involve combinations of the above noted aspects of the invention. Other aspects of the invention may involve methods for forming the probe devices of the aspects noted above. Other aspects may involve apparatus that can be used in implementing one or more of the method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIG. 19 depicts a side view of a probe with two joint/contact positions highlighted.

FIGS. 20A-20D depict side views of four exemplarily joint/contact configurations for an arm and a pushing rod.

FIGS. 21A-21D depict side views of four exemplarily joint/contact configurations for a shaft and a pushing rod.

DETAILED DESCRIPTION OF PREFERRED EMBODIMENTS OF THE INVENTION

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
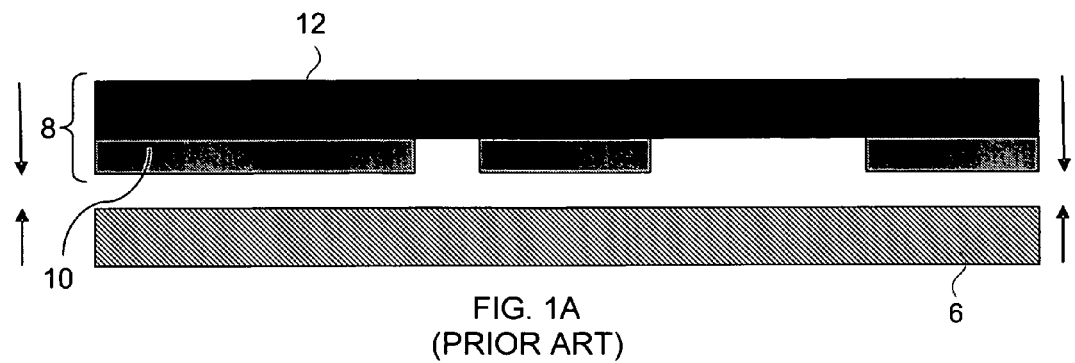
FIGS. 1A-1C schematically depict side views of various stages of a CC mask plating process, while FIGS. 1D-1G schematically depict a side views of various stages of a CC mask plating process using a different type of CC mask.
Figure 1B:
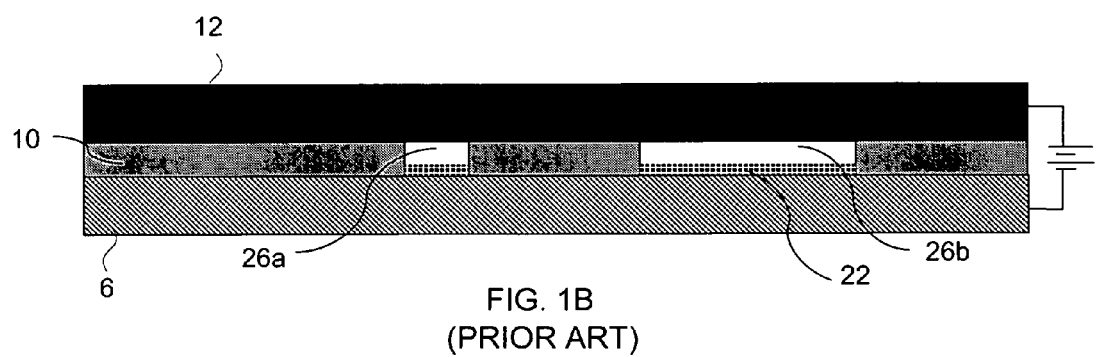
Figure 1C:
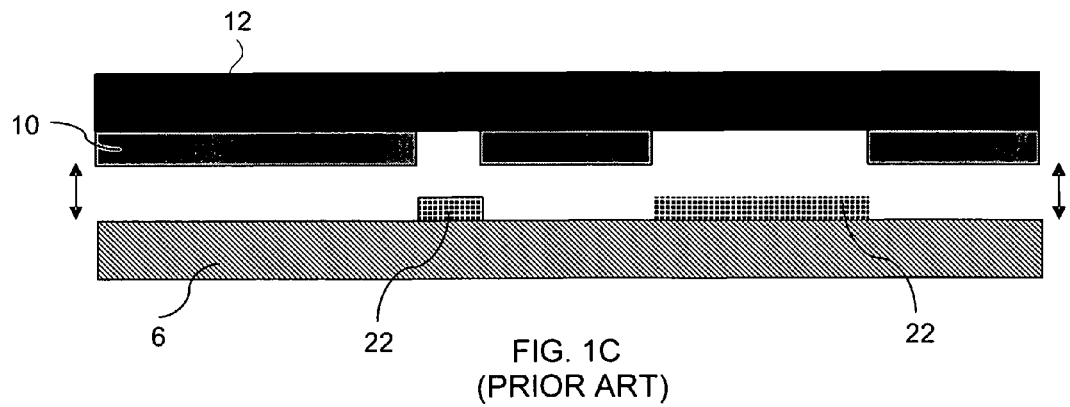
Figure 1D:
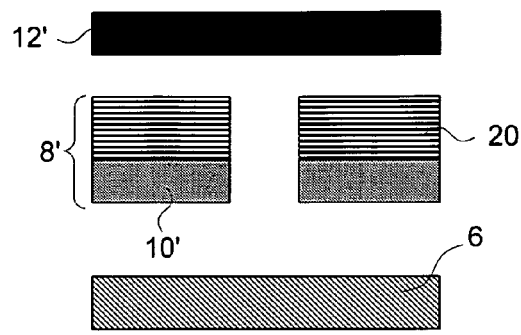
Figure 1E:
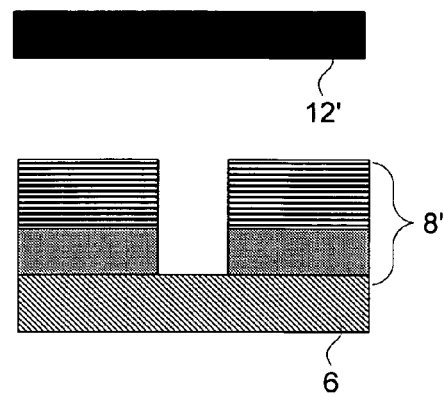
Figure 1F:
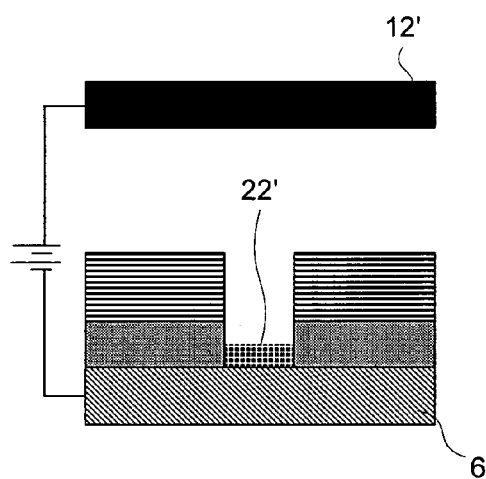
Figure 1G:
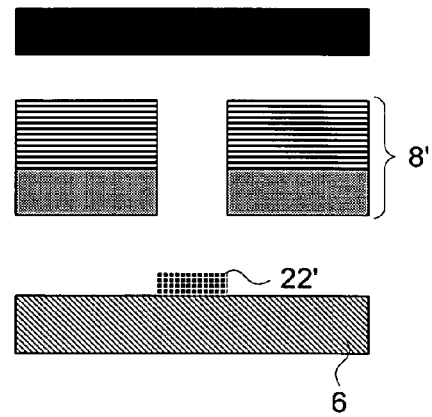
Figure 2A:
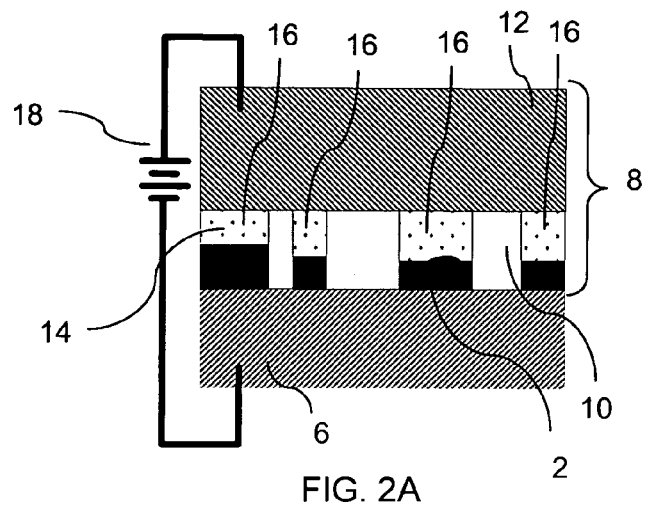
FIGS. 2A-2F schematically depict side views of various stages of an electrochemical fabrication process as applied to the formation of a particular structure where a sacrificial material is selectively deposited while a structural material is blanket deposited.
Figure 2B:
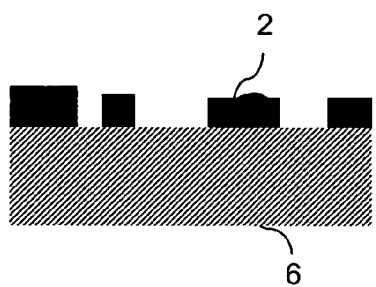
Figure 2C:
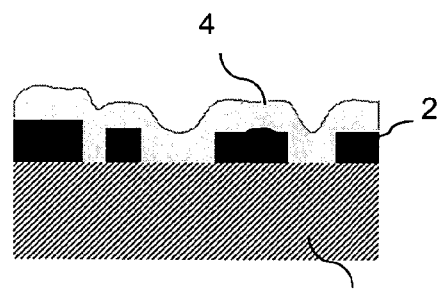
Figure 2D:
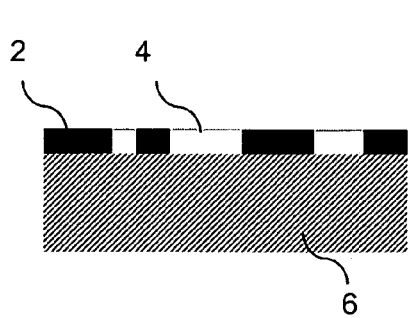
Figure 2E:
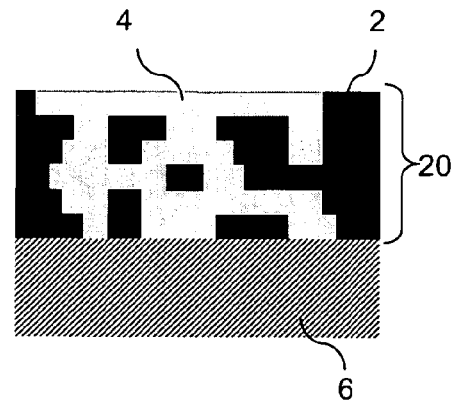
Figure 2F:
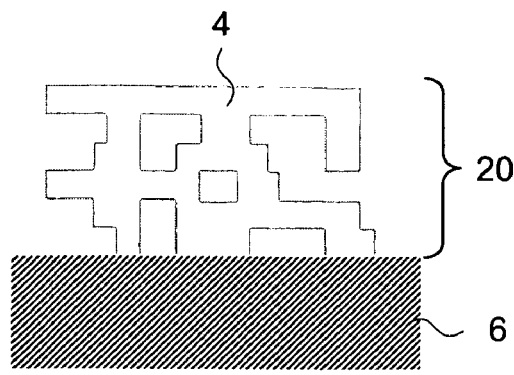
Figure 3A:
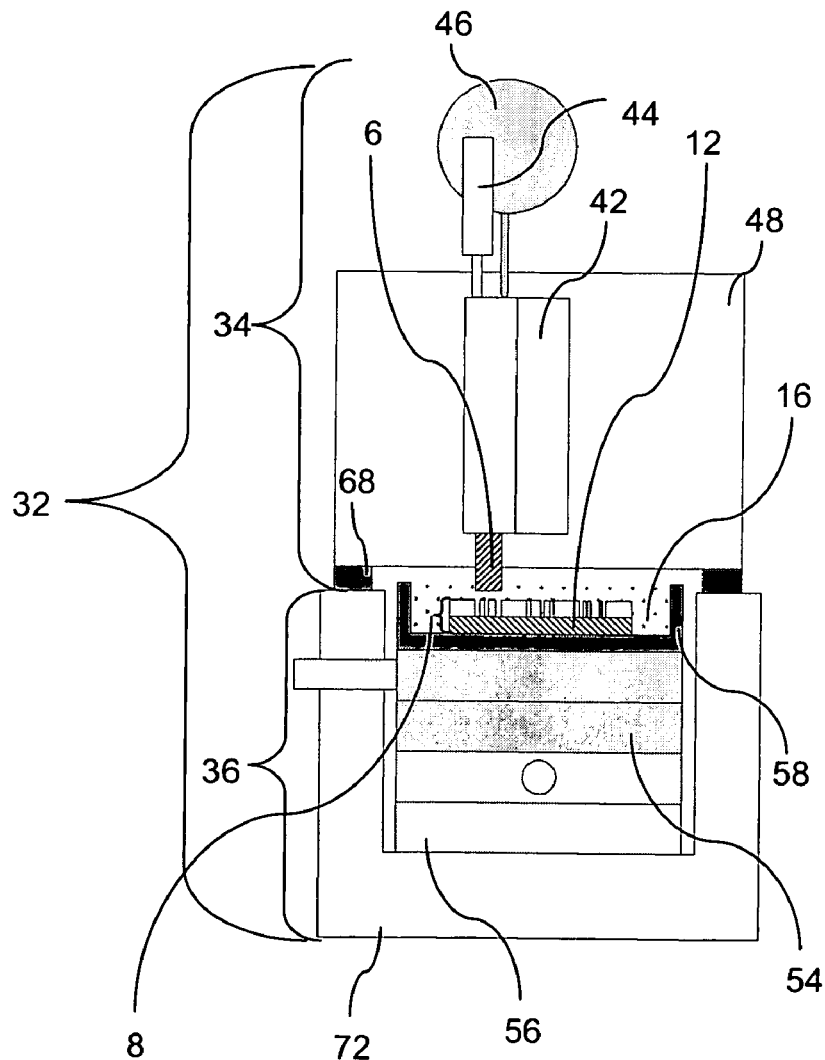
FIGS. 3A-3C schematically depict side views of various example subassemblies that may be used in manually implementing the electrochemical fabrication method depicted in FIGS. 2A-2F.
Figure 3B:
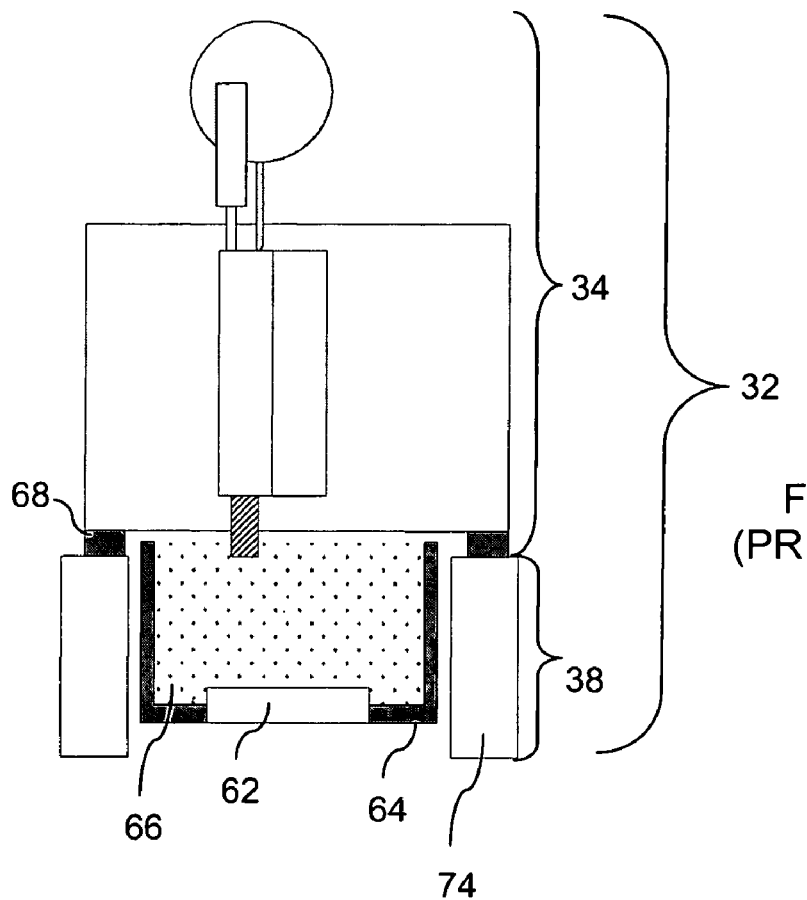
Figure 3C:
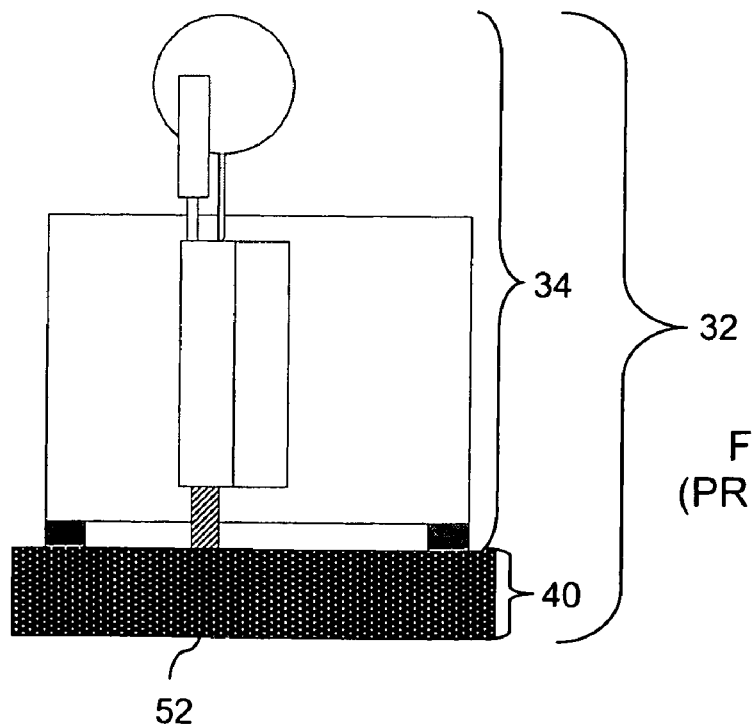
Figure 4A:
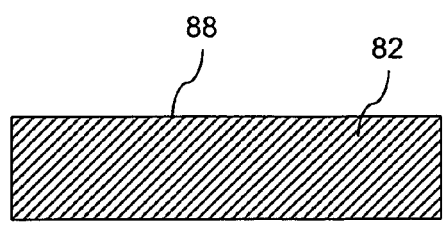
FIGS. 4A-4I schematically depict the formation of a first layer of a structure using adhered mask plating where the blanket deposition of a second material overlays both the openings between deposition locations of a first material and the first material itself.
Figure 4B:
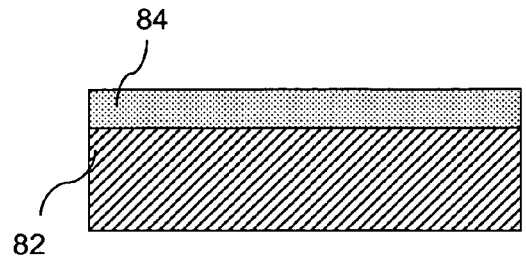
Figure 4C:
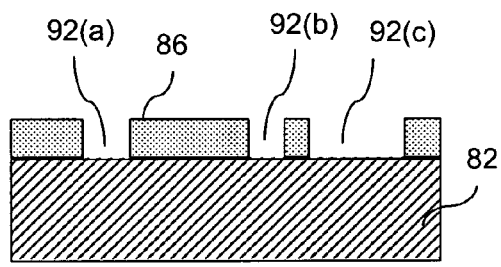
Figure 4D:
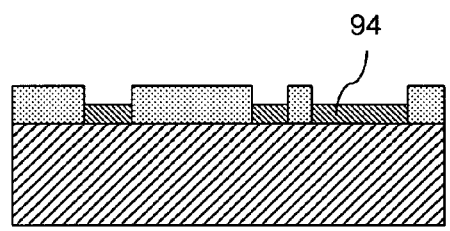
Figure 4E:
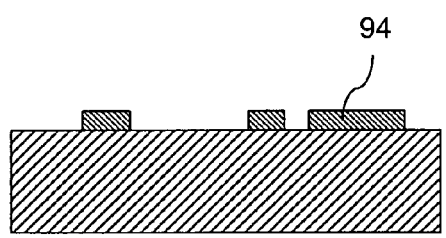
Figure 4F:
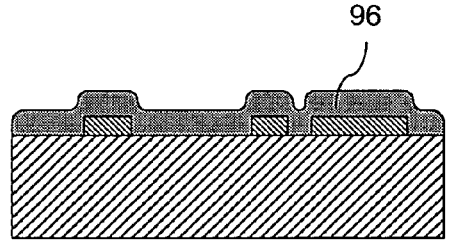
Figure 4G:
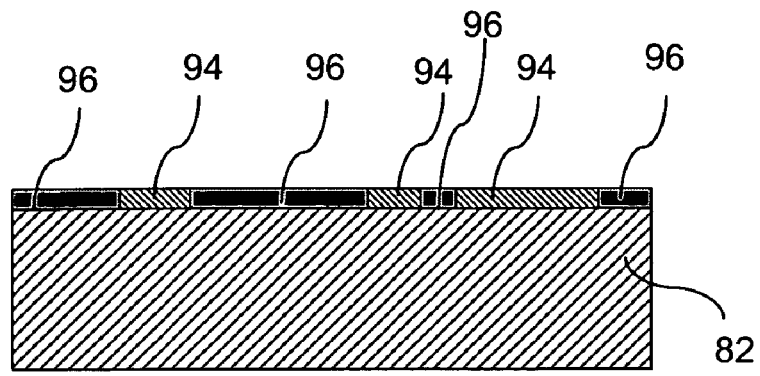
Figure 4H:
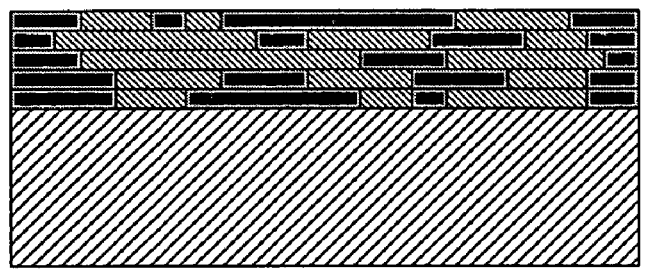
Figure 4I:
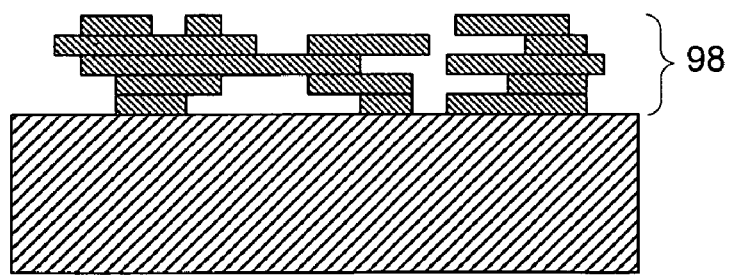

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may be combined with or be implemented via electrochemical fabrication techniques. Such combinations or implementations may be used to form multi-layer structures using a single patterning technique on all layers or using different patterning techniques on different layers. For example, different types of patterning masks and masking techniques may be used or even techniques that perform direct selective depositions may be used without the need for masking. For example, conformable contact masks may be used during the formation of some layers or during some selective deposition or etching operations while non-conformable contact masks may be used in association with the formation of other layers or during other selective deposition or etching operations. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

Figure 5:
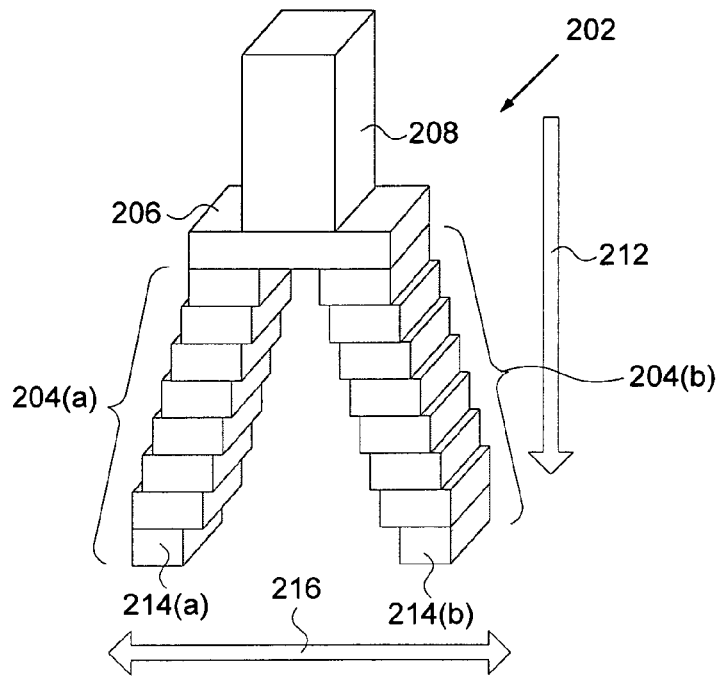
FIG. 5 illustrates a probe of a first embodiment that includes two contact arms/elements that have an outward taper.

FIG. 5 illustrates a probe 202 that includes two contact arms 204(*a*) and 204(*b*) that are connected by a bridge element 206, which in turn connects to a rod 208. The rod 208 forms part of or connects to the rest of a testing system which may include positioning elements and connections or components for performing electrical tests of a circuit pad to which elements 204(*a*) and 204(*b*) will contact. Probe 202 will be driven to contact a pad (not shown) by moving it vertically in the direction of arrow 212. As the pad is contacted the vertical motion of the probe will be translated into horizontal movement of tips 214(*a*) and 214(*b*) which will result in a scrubbing of the pad surface which will tend to remove any dielectric coating on the pad or on the probe tips, thereby allowing electrical contact to be made. As contact with the pad is made, tips 214(*a*) and 214(*b*) will spread in the direction indicated by arrow 216.

Various alternatives of the embodiment of FIG. 5 are possible. In some alternative embodiments, rod 208 may be excluded in favor a vertically compliant structure or other structural element. In some alternative embodiments the bridge element 206 may be a multilayer structure which may be rigid or compliant. In some alternative embodiments, contact elements 214(*a*) and 214(*b*) may be formed from a different material than that forming other parts of arms 204(*a*) and 204(*b*). In still other alternative embodiments, contact elements 214(*a*) and 214(*b*) may be formed in a different process than that used to form other portions of the probe elements. In some embodiments, the probe 202 may actually only be a portion of a larger probe design which includes compliant regions, shields, or the like (e.g. probe 202 may be considered a multi-layer probe tip structure as opposed to an entire probe). In some alternative embodiments additional arm-like elements and contact elements may used. In still other embodiments, the various layer steps in the structure may each be made of multiple layers, the layer thickness used may be much smaller than the structural height and/or the layers may offset in a more uniform manner such that the discontinuities between layers is less noticeable. In some alternative embodiments a smaller number of layers may be used or a larger number of layers. Various elements of these alternative embodiments may be the basis of alternatives to the various other embodiments set forth hereafter and/or may combined with one another or with other alternatives to form other embodiments.

Figure 6:
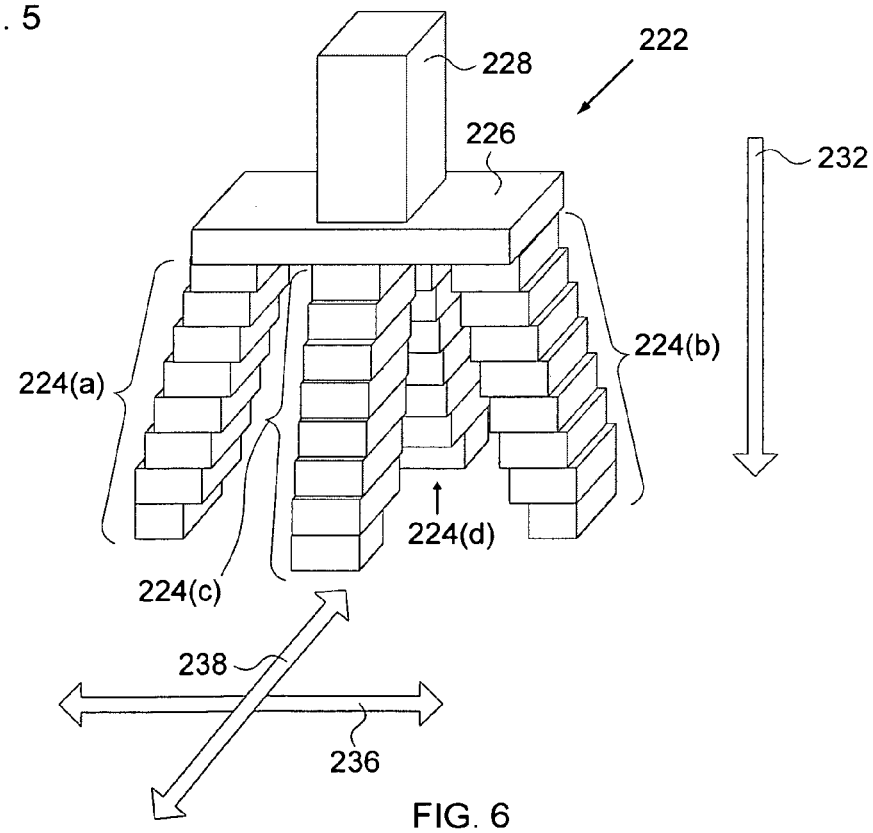
FIG. 6 illustrates a second embodiment of a probe wherein the probe includes four contact elements that taper in an outward direction.

FIG. 6 illustrates an alternative embodiment where the probe 222 includes four contact elements 224(*a*)-224(*d*), along with bridge element 226 and rod 228. To contact a pad to be tested, the probe is moved in the direction of arrow 232, and as contact with the pad is made arms 224(*a*) and 224(*b*) move radially outward in the direction shown by arrow 236 while elements 224(*c*) and 224(*d*) spread outward in the direction shown by arrow 238.

Figure 7:
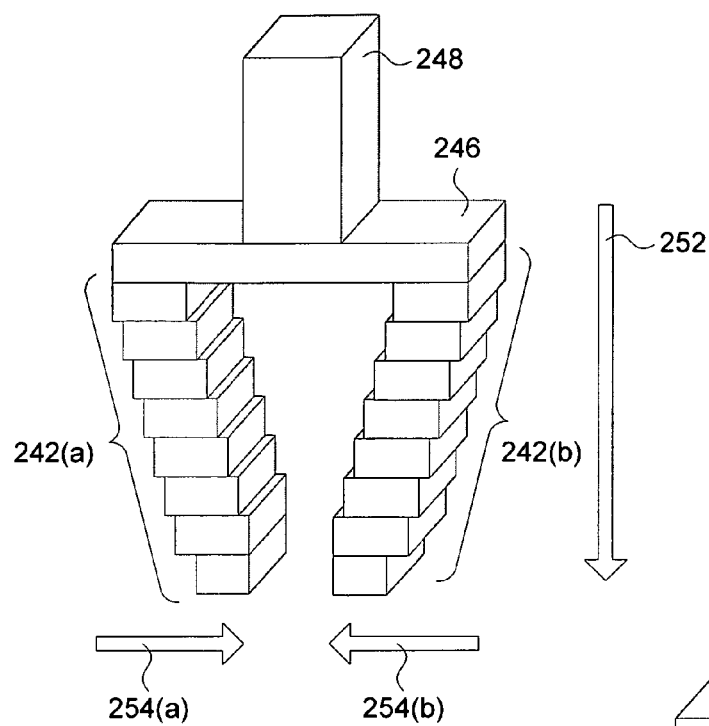
FIG. 7 illustrates a probe of a thrid embodiment that includes two contact arms/elements that have an inward taper.

FIG. 7 shows another alternative embodiment for a probe device which includes two contact arms 242(*a*) and 242(*b*) connected to a bridge element 246 and a support and movement rod 248. The probe is moved vertically to contact a pad (not shown) to be tested where the movement is in the direction indicated by arrow 252. As the pad is contacted the two contact arms 242(*a*) and 242(*b*) slide towards each other in the directions indicated by arrows 254(*a*) and 254(*b*).

Figure 8:
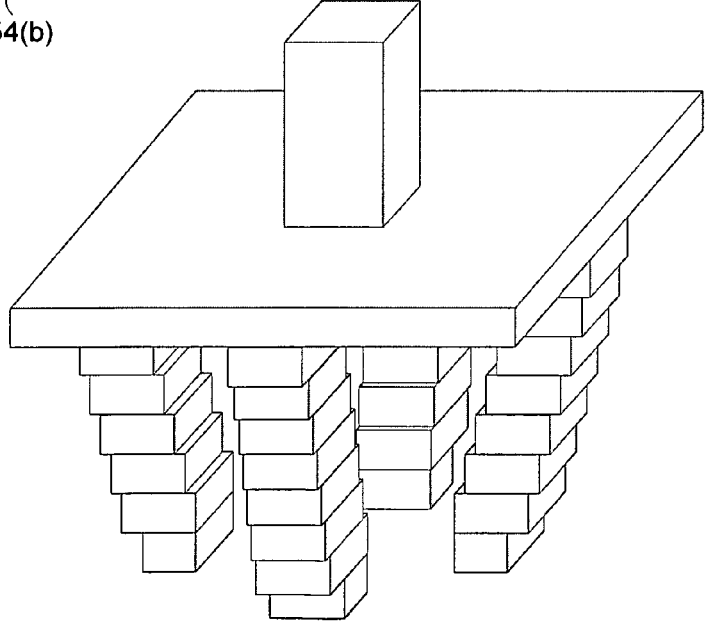
FIG. 8 illustrates a fourth embodiment of a probe wherein the probe includes four contact elements that taper in an outward direction.

FIG. 8 shows a further alternative embodiment where the probe is similar to that of FIG. 7 with the exception that two additional probe arms are included.

Figure 9A:
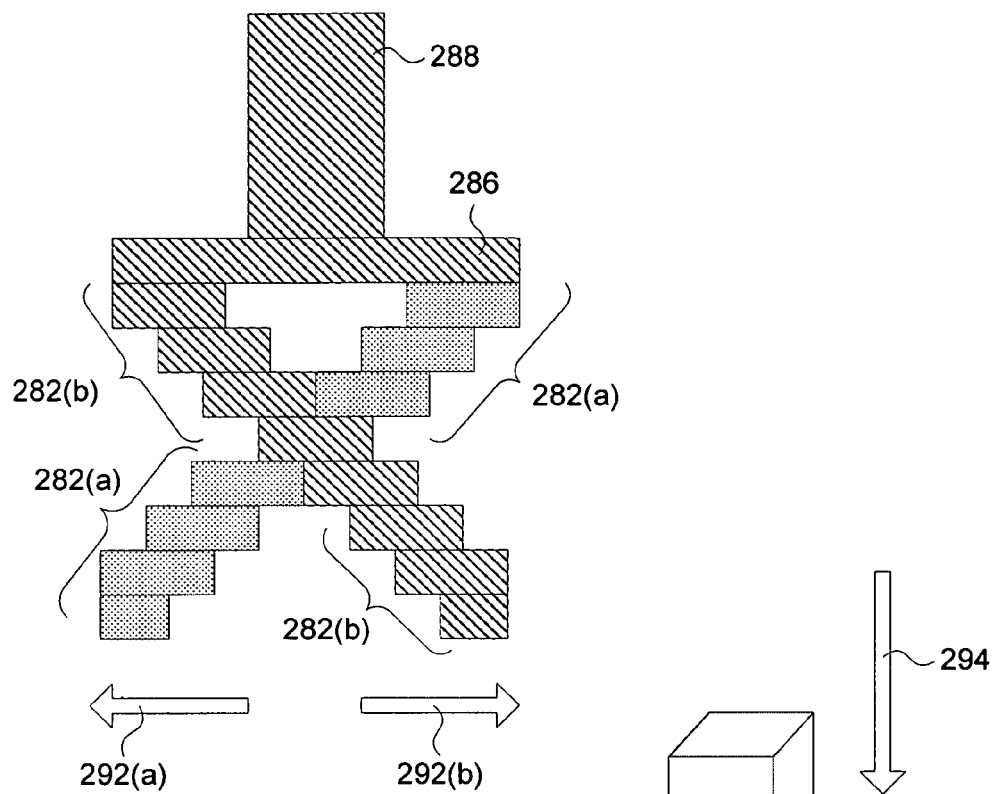
FIGS. 9A and 9B depict respectively a side view and a perspective view of a probe having three arm/contact elements.

FIG. 9A depicts a side view of a probe that includes contact arms 282(*a*) and 282(*b*). The contact arms are directed in opposing directions and are offset from one another (as can be better seen in FIG. 9B) so that they do not contact one another. The contact arms join a common bridge element 286 which in turn connects to a rod 288 which can be used to move the probe vertically up and down to bring it into and away from contact with an electrical pad to be probed. As the probe is moved downward and it contacts an electrical pad to be tested (not shown), arm 282 scrubs in the direction indicated by arrow 292(*a*) while arm 282(*b*) scrubs in the direction shown by arrow 292(*b*).

Figure 9B:
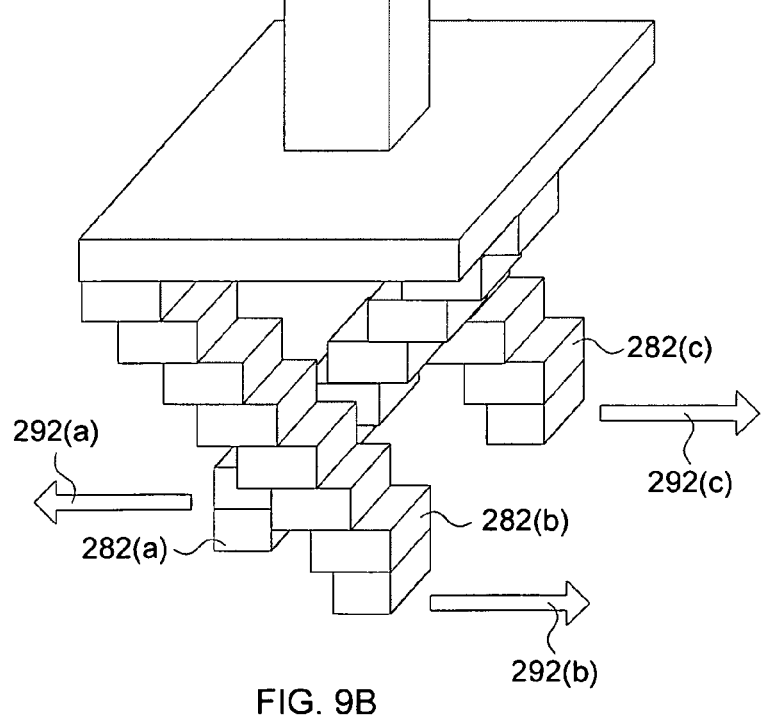

A perspective view of the structure of FIG. 9A is shown in FIG. 9B where it can be seen that the probe includes three contact arms 282(*a*), 282(*b*) and 282(*c*). As the probe is moved in the direction indicated by arrow 294 and contact is made with the pad to be tested, arms 282(*a*), 282(*b*) and 282(*c*) move in the directions indicated by arrows 292(*a*), 292(*b*), and 292(*c*) respectively.

Figure 10:
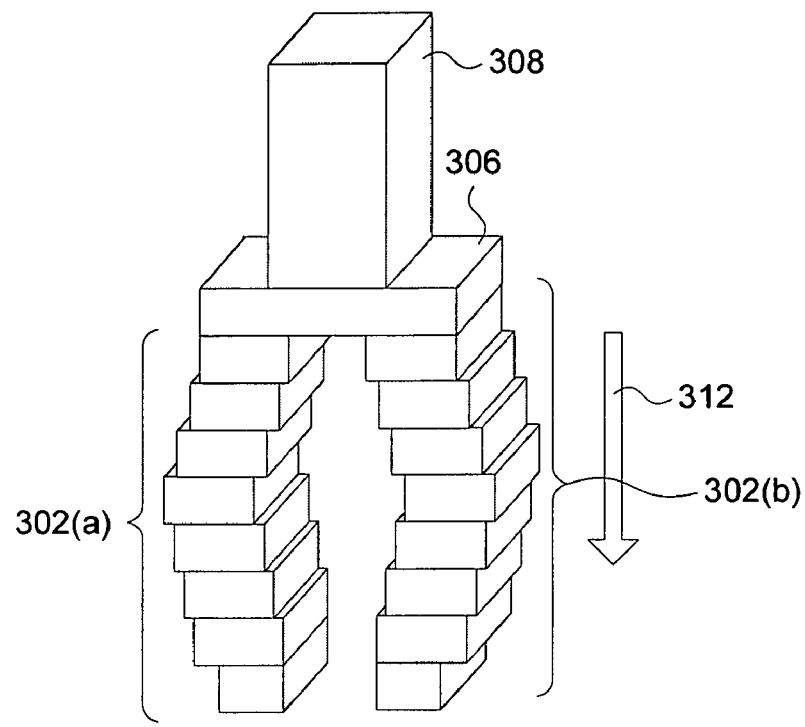
FIG. 10 depicts a perspective view of another probe embodiment where the probe has two contact arms with each have a small curvature.
Figure 11:
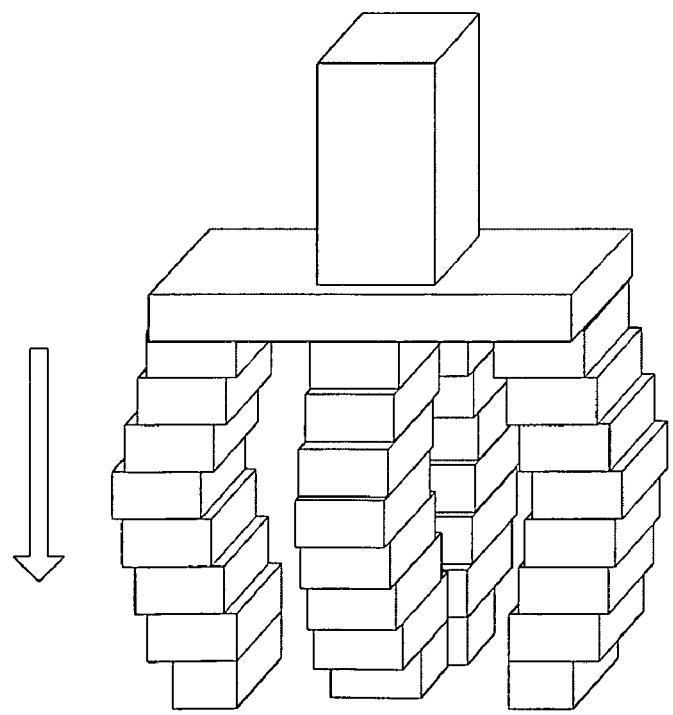
FIG. 11 depicts a perspective view of another probe embodiment where the probe has four contact arms with each have a small curvature.

FIGS. 10 and 11 illustrate a further embodiment of probe elements. The probe of FIG. 10 is shown as having two arms 302(*a*) and 302(*b*) connected by a bridge element 306 which in turn is connected to rod element 308. As the arm elements 302(*a*) and 302(*b*) have both an inward and outward bend they provide some amount of compliance as a pad is contacted but they provide little or no scrapping or scrubbing of the pad surface during at after contact is made. As such, a probe of this type may have more difficulty in penetrating any dielectric coating located on the pad surface. Some scrubbing may be provided in embodiments where the inward and outward curvatures are of different magnitudes (e.g. when the contact regions are not located directly below the regions where the arms join the bridge element). To assist in the scrubbing process rod 308 may be made to undergo slight movement or vibration in a horizontal direction thereby causing the two contact arms to scrub the surface free of any conductivity inhibiting dielectric. Such vibration may be of any appropriate frequency and magnitude which is sufficient to cause successful scrubbing without causing damage to the electrical component being tested or the probe elements themselves.

FIG. 11 illustrates another alternative embodiment where the probe is similar to that of FIG. 10 with the exception that four contact arms are present instead of two.

Figure 12:
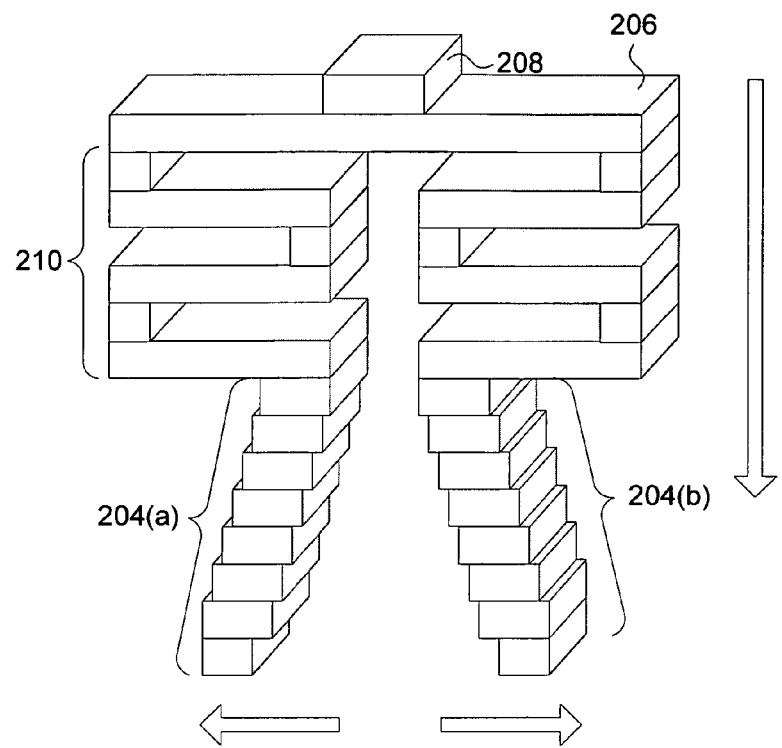
FIG. 12 illustrates a probe of another embodiment where the probe includes two contact arms/elements that have an outward taper and a conformable or compressible element.

FIG. 12 depicts another alternative embodiment with contact arms 204(*a*) and 204(*b*) that are similar to those of FIG. 5.

The probe includes a rod 208 and a bridge element 206 as did the embodiment of FIG. 5. However FIG. 12 additionally includes, disposed between bridge 206 and arms 204(a) and 204(b), a compliant member 210. As the probe is made to contact a pad (not shown), at the lower surfaces of arms 204(a) and 204(b), the compliant element 210 compresses. This compression reduces the risk of arms 204(a) and 204(b) damaging the electronic component, it also ensures a steady contact force between arms 204(a) and 204(b) and the pad (not shown), and allows for any vertical displacement necessary to bring an array of contact elements into contacting position with their respective pads. In other embodiments different width to height aspect ratios may be used, additional arms and associated compliant structures may be added, and/or the bridging element or a secondary bridging element may be located at the bottom and/or in the middle of the compliant portion of the structure (e.g. if the compliant structure took the form of discs separated by large diameter rings and small diameters rings or rods-bellows-like structures).

Figure 13:
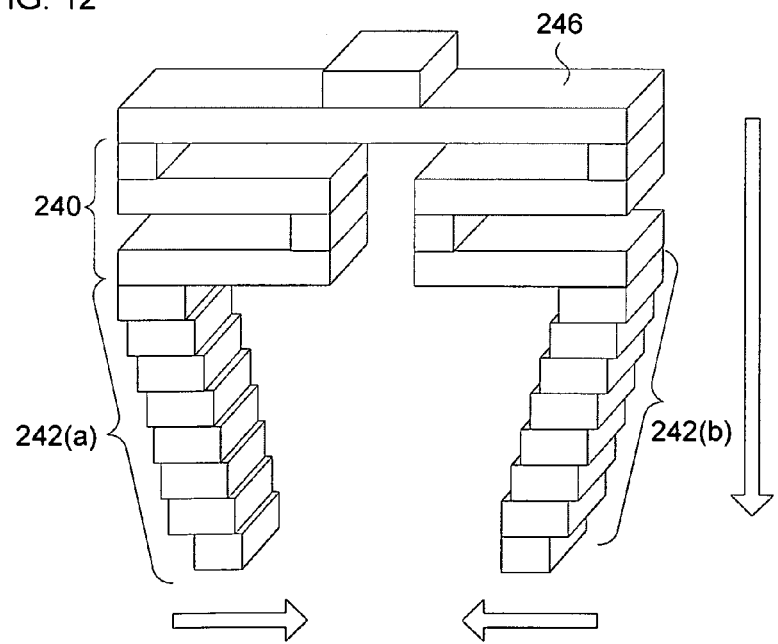
FIG. 13 illustrates a probe of a first embodiment that includes two contact arms/elements that have an outward taper and where it additionally includes a conformable element between the arms and a bridging element.

FIG. 13 depicts an additional alternative embodiment with contact arms similar to those shown in FIG. 7 with the addition of a compliant element 240 located between contact arms 242(a) and 242(b) and bridge element 246.

Figure 14:
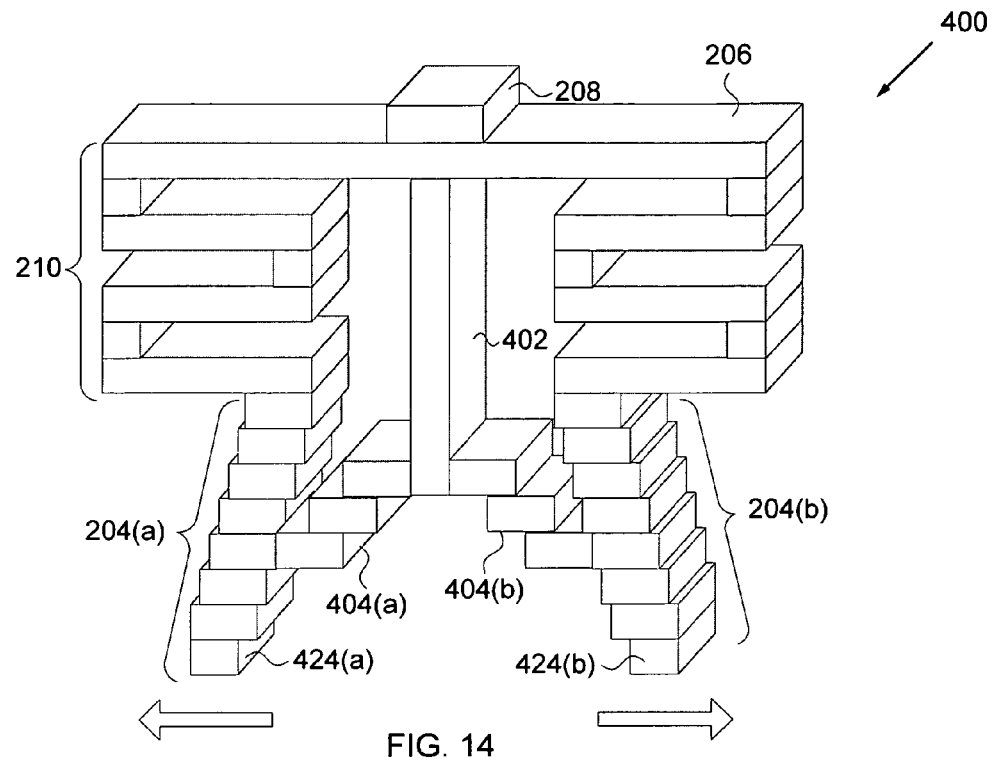
FIG. 14 depicts a further embodiment of a probe wherein the probe is similar to that of the embodiment of FIG. 12 with the exception that the probe additionally includes a drive shaft that forces a pair of pushing elements to cause the contact arms to separate.

FIG. 14 depicts a probe having arms 204(a) and 204(b), a compliant member 210, a bridging element 206, and a rod 208 which are similar to those depicted in the embodiment of FIG. 12. The embodiment of FIG. 14 additionally includes a shaft 402 which abuts bridge element 206 and pushing elements 404(a) and 404(b). As rod 208 is driven downward forcing the probe 400 against a pad to be tested, compliant member 210 compresses thereby driving shaft 402_downward which in turn forces pushing elements 404(a) and 404(b) to assume more horizontal positions which force the separation of arms 204(a) and 204(b). This in turn forces the tips 424(a) and 424(b) of the arms to. scrub the surface of the pad thereby enhancing the electrical contact between the probe and the pad.

Figure 15:
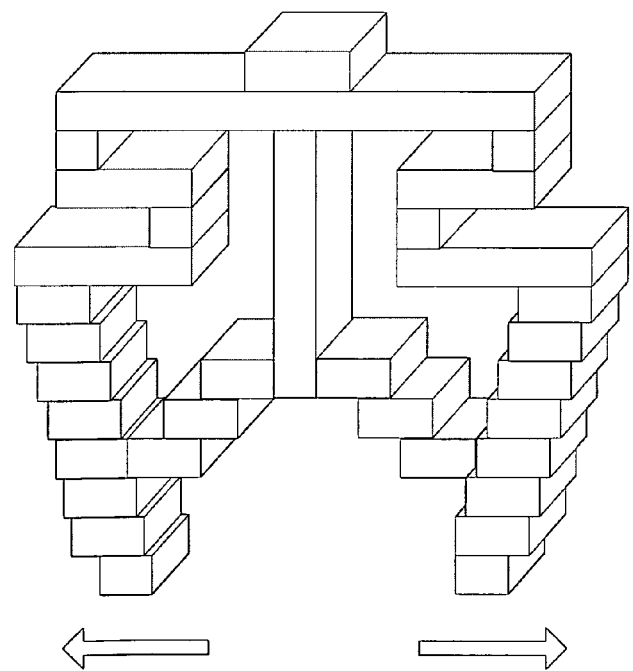
FIG. 15 depicts and embodiment similar to that of FIG. 14 however with the arms taking on the configuration of the embodiment of FIG. 13.

FIG. 15 depicts an additional alternative embodiment having arms, a bridging element, and a rod similar to that of FIG. 13 as well as a compliant element similar to but with a slightly different configuration than that shown in FIG. 13 and where the embodiment includes a shaft and pushing elements similar to those of the embodiment of FIG. 14.

Figure 16:
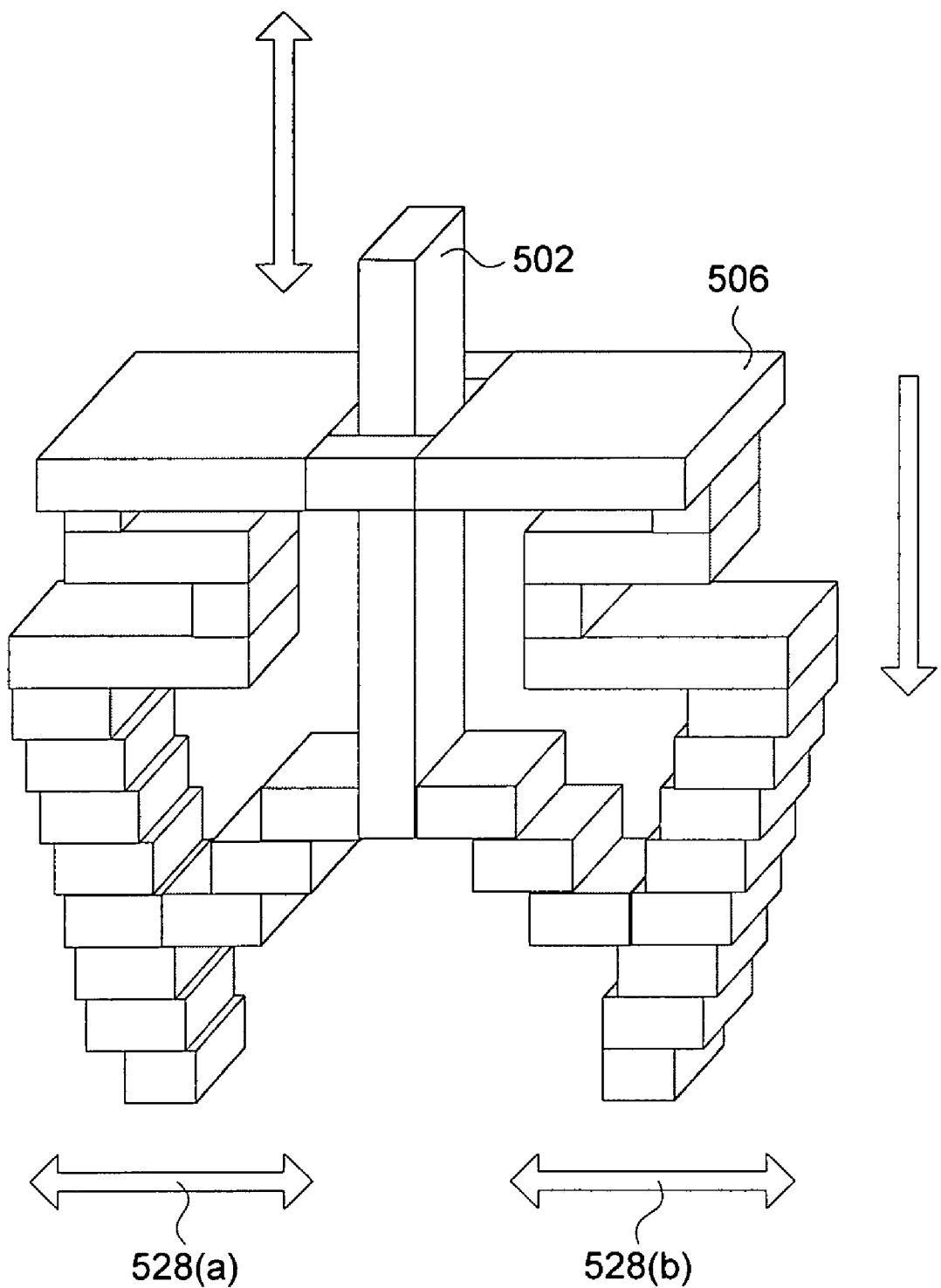
FIG. 16 depicts a further alternative embodiment where a probe includes a shaft that can move independently of the movement of a bridge element such that both inward and outward motion of the contact arms can be made to occur.

FIG. 16 depicts a further alternative embodiment where the shaft 502 is capable of separate movement relative to bridging element 506 such that relative upward and downward movement of shaft 502 can cause either inward or outward movement, respectively, of the arms in the directions indicated by arrows 528(a) and 528(b).

Figure 17:
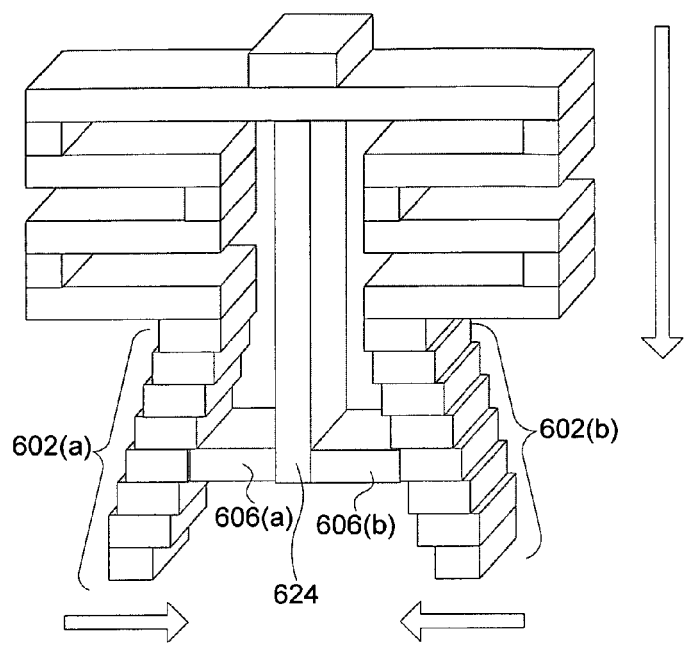
FIG. 17 depicts a further alternative embodiment where a probe includes a shaft to which elements are attached that may be used to pull the contact arms inward.

FIG. 17 depicts a further embodiment similar to that of FIG. 14, with the exception that it does not include pushing elements that cause the arms to split apart upon making contact with a pad to be tested. Instead, in this embodiment, pulling elements 606(a) and 606(b) connect the shaft 624 to the arms 602(a) and 602(b). In this embodiment, the connecting arms extend horizontally such that any downward movement of the shaft causes a deflection of the pulling elements that in turn cause the separation between the ends of the arms to decrease. In other embodiments, the pulling elements may take on other configurations (e.g. a downward slant toward the shaft).

Figure 18:
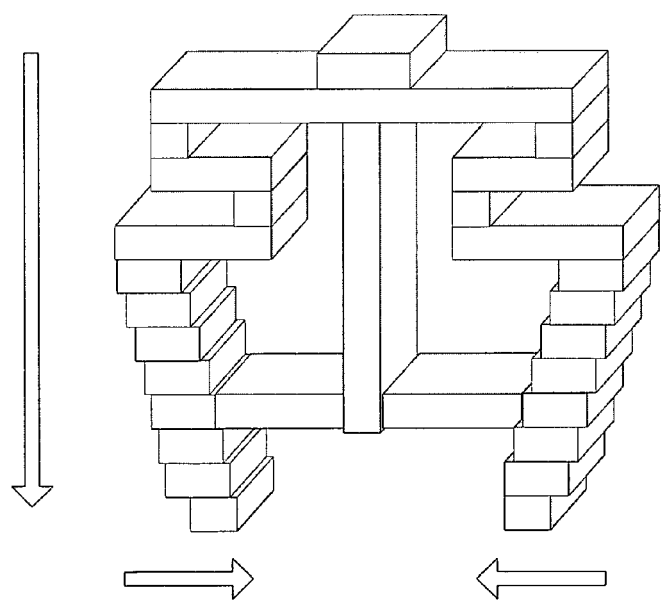
FIG. 18 depicts a further alternative embodiment which is similar to the embodiment of FIG. 17 with the exception that the contact arms have an inward slant.

The embodiment of FIG. 18 is similar to that of FIG. 17 with the exception that the arms point inward instead of outward.

FIGS. 19-21 depict various examples of joint/contact possibilities that may exist between the arms and the separating elements (i.e. in the regions encircled by element 19) and between the separating elements and the shaft (as indicated by element 20).

FIGS. 20A and 21A indicate that the connections may be of a fixed nature such that movement occurs by flexing of the separating elements and/or the shaft and/or the arms. FIGS. 20B and 21B indicate that the positioning of the elements may be by having them abut against one another. FIGS. 20C and 21C indicate that the positioning/connection may be via a hinge like structure (such a structure can be built directly using electrochemical fabrication by leaving a small region of sacrificial material between the moving elements so that after release the elements can move relative to one another). FIGS. 20D and 21D indicate that the elements may be moveably connected by a ball and socket-type joint (such a structure can be built directly using electrochemical fabrication by leaving a small region of sacrificial material between the moving elements so that after release the elements can move relative to one another).

In various alternative embodiments the positioning/connecting elements may take on various other forms. In still other embodiments different types of joints/contacts may be used in the shaft-to-pushrod region and in the pushrod-to-arm region.

In still other embodiments, compliant members may be used that have different configurations than the specific spring-like elements shown. In still other embodiments different numbers of arms may be used; the arms may be extended at different angles; they may include different numbers of layer elements; the arms and separating elements may take on other configurations that result in non-radial scrubbing of the pad surface, and the like. In still other embodiments, horizontal movement or vibration of the contact arms/elements may be used to enhance scrubbing.

The configuration of the tips of the arms that contact the pad to be tested (i.e. the contact region of the arms) may take on different configurations than those illustrated. For example, the tips (i.e. contact region) of the arms may be narrower than the width of the arms in a direction perpendicular to a direction used for scrubbing. The tips may be shorter than a length of the arms in a direction parallel to the direction used for scrubbing. The contact region of the arm may be formed from a different material than that used to form the bulk of the arms. The contact region of the arms may be located relative to the rest of the arm such that during movement of the arms (during a scrubbing motion), the contact region experiences a desired force distribution that, for example, may cause the orientation of the contact region to become non-parallel to the plane of the pad being contacted. Such a change in orientation may cause a desired biting or scrapping effect between the pad and the contact region such that the effectiveness of scrubbing (i.e. breaking through any oxide or other dielectric layer) is enhanced.

In still other embodiments, the positioning of the arms relative to any compliance member and more particularly relative to any movement of the compliance member may be selected so as to cause the contact region of the arms to take on an orientation that is non-parallel to that of a pad being contacted. The orientation may be such that the leading edge of the contact region (e.g. edge of the layer forming the contact region) digs into the pad or such that a desired side edge or trailing edge of the contact region digs into the pad so as to cause an enhanced scrubbing effect.

In some preferred embodiments the probe structures depicted may be formed using electrochemical fabrication techniques of the contact mask (e.g. conformable or non-conformable type) or bonded (e.g. adhered) mask type (e.g.

via through mask plating using patterned photoresist masks as selective electroplating patterns). In some embodiments arrays of probes may be formed simultaneously using electrochemical fabrication techniques. In still other embodiments the rods and possibly the bridge elements and parts of the arms may be part of a central conductor of coaxial transmission lines which helps minimize signal loss.

In some embodiments the thickness of individual layers forming a microprobe may be much thinner than the overall height and/or width of the microprobe component in which case sloping elements of the probe may take on a smooth or continuous appearance. This is illustrated in the microprobes structures of FIGS. 22-25.

Figure 22:
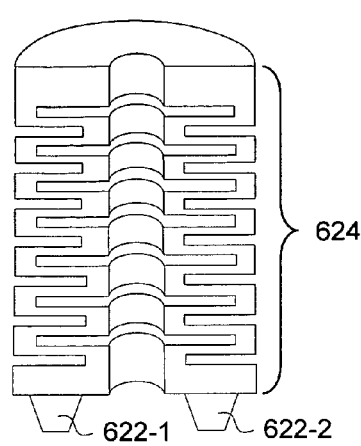
FIG. 22 depicts a perspective view of a cut through a bellows type probe element of another embodiment of the invention.
Figure 23:
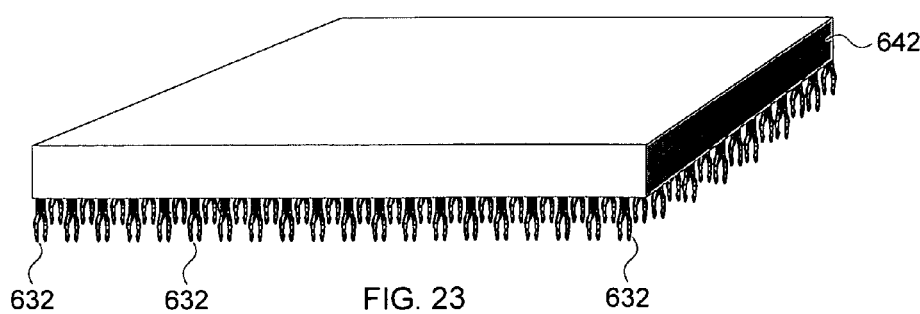
FIG. 23 depicts a perspective view of an array of probes mounted to a substrate.

In some embodiments contact arms (e.g. the portion of a probe that is connected to contact regions) may move relative to one another to allow scrubbing or even to cause scrubbing to occur. In some embodiments, the arms of the probe may be relatively short compared to the height of a conformable portion of the probe element. An example of such a probe is illustrated in FIG. 22 where the probe comprises a bridging element 624 which connects to arms 622-1 and 622-2 and where the bridging element includes a compressible structure which provides compliance as the probe and pad make contact. In some embodiments, arms 622-1 and 622-2 may have mounted on their distal, or contact, regions tips configurations. These tip configurations may be such that during compression of the compliant structure, as contact is being established, a relative horizontal movement of the tips occurs that causes a scrubbing between at least one of the tips and the pad to occur. In still other embodiments a large number of probes may be formed on or attached to a single support structure to form a probe array of desired configuration. An example of such a probe array is illustrated in FIG. 23. The probe array of FIG. 23 may be obtained by either electrochemical fabrication of the probes 632 onto substrate 642 or the attachment of the probes to the substrate after formation.

Figure 24A:
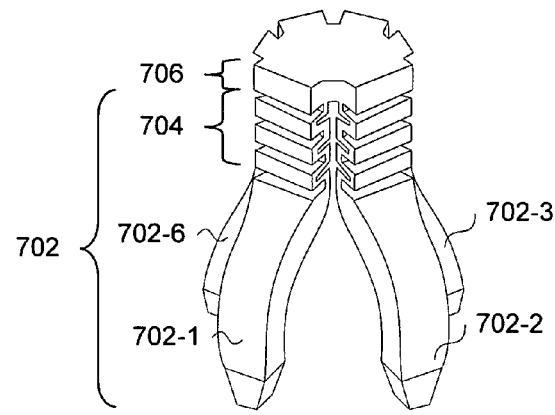
FIGS. 24A and 24B depict a perspective and top view, respectively of a multiple contact element microprobe according to another embodiment of the invention.
Figure 24B:
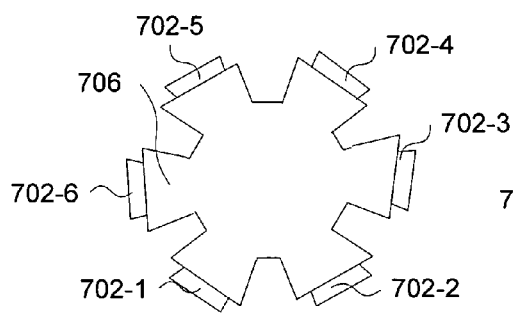

In some embodiments conformable portions of a probe element having multiple arms may be associated with each individual arm. An example of such a probe is illustrated in FIGS. 24A and 24B. The probe includes a bridging element 706, and compliant elements 704 which form the upper portion of each of six arms 702-1 to 702-6 (of which only 4 are shown).

Figure 25:
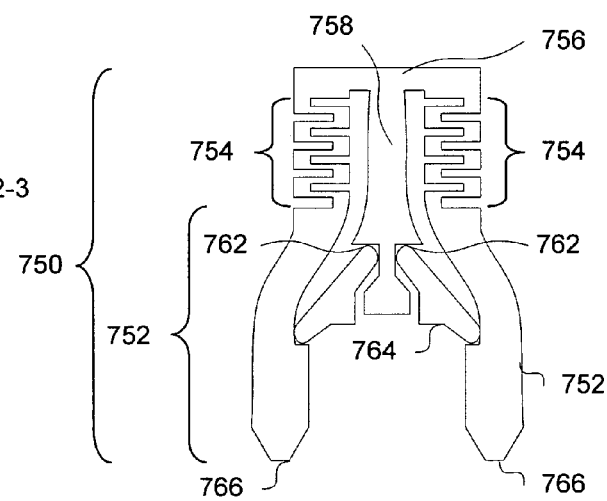
FIG. 25 depicts a side view of a multiple contact element probe (as cut through its center) according to another embodiment of the invention.

FIG. 25 depicts a side view of a probe element formed with layers which are thin compared to the overall height 750 of the probe element where the probe has two arms 752, connected to a bridging element 756 via compliant (i.e. compressible) structures 754. The compressible structure 754 may be a single structure that functions as part of the bridging element or they may be individual structures that function as part of each arm. A central drive shaft 758 is lowered as the structures 754 compresses in response to the probe being driven against the pad which in turn causes inner most ends 762 of the two transfer elements 764 to move downward which in turn causes the transfer elements to spread arms 752 outward so as to cause scrubbing of their contact tips 766 against the pad.

Figure 26:
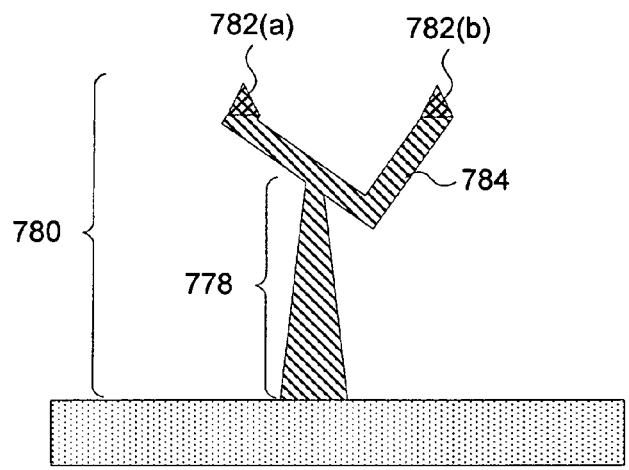
FIG. 26 depicts a side view of an alternative probe (or possibly probe tip configuration) which includes two contact tips.

FIG. 26 provides a probe configuration 780 that includes a shaft 778 that offers little compliance but an ability to cause scrubbing of a contact pad as the two probe tip elements 782(a) and 782(b) make contact and then are forced slightly apart as compression causes bridging element 784 to flex. In some embodiments, the amount of stress to which bridging element 784 is subjected is preferably less than that which will result in plastic deformation of the element. In situations where more compliance is desired the probe configuration of FIG. 26 may replace shaft 778 with a more compliant structural element or group of elements. In some alternative embodiments the bridging element may be symmetric in design and one or more additional arms and tips may be added to it. In some alternative embodiments, the bridging element may take on a more curved (as opposed to angular) configuration. In some embodiments, the bridging element may curve downward with the tips extending a sufficient distance to allow contact to the pad without the shaft contacting the pad. In some embodiments, the tips may be formed of the same material as the bridging element while in other embodiments they may be of a different material. In some embodiments, the tips may be formed in such a way so that they have tapped configurations as shown or they may take on other configurations. In some embodiments, the shaft or other structural element may contact the bridging element along a relatively straight portion of the bridging element while in other embodiments, contact may be made at a transitional (e.g. angled or curved portion of the bridging element.

Figure 27A:
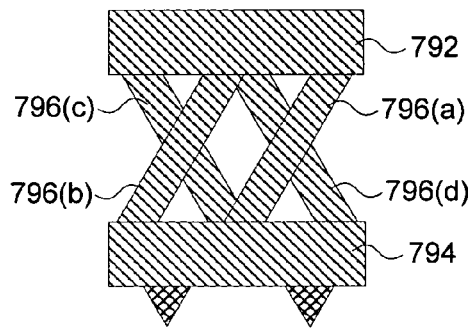
FIGS. 27A-27C depict a side view and two bottom views of a cylindrical probe structure that includes top and bottom rings connected by a plurality of non-vertical extending elements.
Figure 27B:
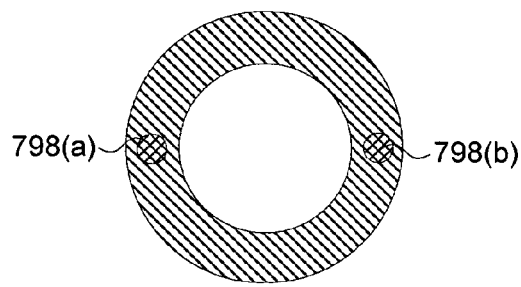
Figure 27C:
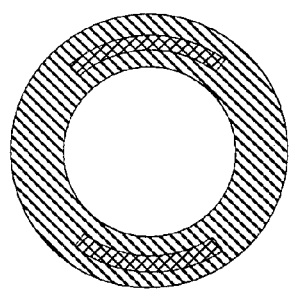

FIGS. 27A-27C provide side views of a cylindrical probe structure with a top ring 792 and a bottom ring 794 jointed by arms 796(a)-796(d) that extend from the perimeter of one ring to the perimeter of the other ring but not in a completely vertical manner such that when the two rings are placed in compression the rings will experience a rotational force. One of the rings may be fixed to a substrate (e.g. a space transformer), other structural elements such as a structure with a desired amount of compliance, or the like while the other ring has one or more probe tip elements 798(a) and 798(b) extending from it as shown in the side view of FIG. 27B and in the bottom views of FIGS. 27B and 27C. As indicated in FIG. 27C, the probe tip need not take on a point like configuration but instead may have an elongated configuration or some other configuration.

Figure 28:
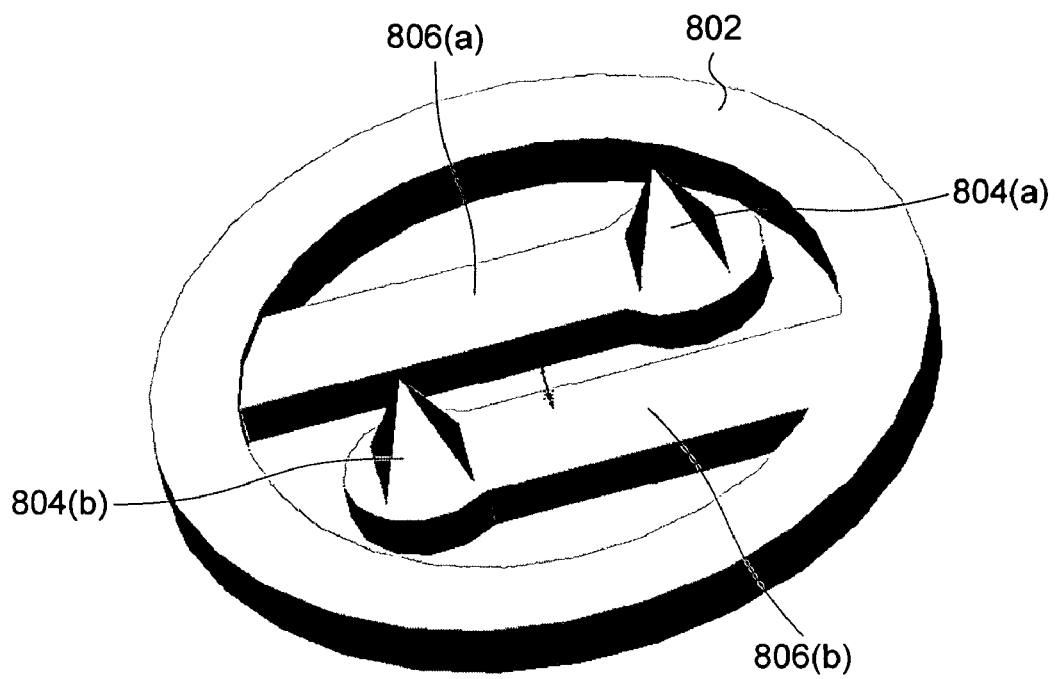
FIG. 28 depicts a perspective view of a portion of a probe bridging ring and two contact tips located on arms extending laterally from the bridging ring.
Figure 29A:
FIGS. 29A-29B depict side views of bridging rings or disks with a plurality of tips located on arms extending both laterally and vertically from the bridging.
Figure 29B:
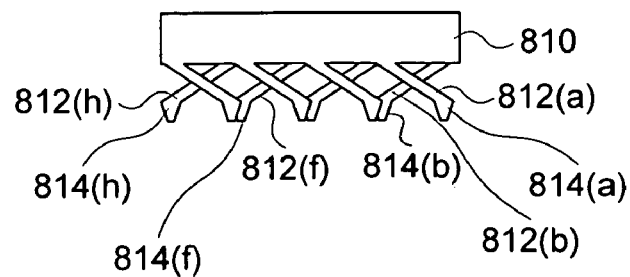

FIG. 28 provides ring element 802 that acts as a bridge element for two probe tips 804(a) and 804(b). The ring element that may be located at the end of various probe structures (not shown, e.g. compliant structures and the like). As shown, the ring has extending from it two lateral extending arms 806(a) and 806(b) on the distal ends of which probe tip elements 804(a) and 80(b) are located. As the ring makes contact with a pad (not shown) the lateral extending cantilever arms bend causing a change in the lateral separation of the probe tips this change in separation may translate into a lateral scrubbing action between at least one of the probe tips and the pad. In other embodiments, more arms and tips may extend from the rings, the rings may take on other configurations (e.g. square, rectangular, oval, non-closed configurations and the like), the tips may be formed as multi-layered structures or tapered structures, and/or the arms may not be completed lateral extending structures but may be formed as multilayer structures of any desired configuration (see FIGS. 29A and 29B). FIGS. 29A and 29B depict side views of ring-like or disc-like structures 810 where a plurality of arms 812(a)-812(h) extend out of the plane of the ring or disc with tips 814(a)-814(h) respectively located thereon. When compression is applied to the tips, each will undergo a horizontal as well as vertical displacement that will produce a scrubbing motion. In FIG. 29A, the tips will undergo a lateral motion that moves them closer together, while in other embodiments (e.g. when the left right arm configurations are reversed), the displacement will cause the tips to move further apart.

Some embodiments may employ diffusion bonding or the like to enhance adhesion between successive layers of material. Various teachings concerning the use of diffusion bonding in electrochemical fabrication process is set forth in U.S. patent application Ser. No. 60/534,204 which was filed Dec. 31, 2003 by Cohen et al. which is entitled "Method for Fabricating Three-Dimensional Structures Including Surface Treatment of a First Material in Preparation for Deposition of a Second Material" and which is hereby incorporated herein by reference as if set forth in full.

Further teaching about microprobes and electrochemical fabrication techniques are set forth in a number of U.S. patent applications which were filed Dec. 31, 2003. These Filings include: (1) U.S. Patent Application No. 60/533,975 by Kim et al. and which is entitled "Microprobe Tips and Methods for Making"; (2) U.S. Patent Application No. 60/533,947 by Kumar et al. and which is entitled "Probe Arrays and Method for Making"; (3) U.S. Patent Application No. 60/533,948 by Cohen et al. and which is entitled "Electrochemical Fabrication Method for Co-Fabricating Probes and Space Transformers"; and (4) U.S. Patent Application No. 60/533,897 by Cohen et al. and which is entitled "Electrochemical Fabrication Process for Forming Multilayer Multimaterial Microprobe structures". These patent filings are each hereby incorporated herein by reference as if set forth in full herein.

Teachings concerning the formation of structures on dielectric substrates and/or the formation of structures that incorporate dielectric materials into the formation process and possibility into the final structures as formed are set forth in a number of patent applications filed on Dec. 31, 2003. The first of these filings is U.S. Patent Application No. 60/534,184, which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multilayer Three-Dimensional Structures on a Porous Dielectric". These patent filings are each hereby incorporated herein by reference as if set forth in full herein.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use selective deposition processes or blanket deposition processes on some layers that are not electrodeposition processes. Some embodiments may use nickel as a structural material while other embodiments may use different materials. Some embodiments may use copper as the structural material with or without a sacrificial material. Some embodiments may remove a sacrificial material while other embodiments may not. Some embodiments may employ mask based selective etching operations in conjunction with blanket deposition operations. Some embodiments may form structures on a layer-by-layer basis but deviate from a strict planar layer on planar layer build up process in favor of a process that interlacing material between the layers. Examples of such build processes are disclosed in U.S. application Ser. No. 10/434,519, filed on May 7, 2003, entitled "Methods of and Apparatus for Electrochemically Fabricating Structures Via Interlaced Layers or Via Selective Etching and Filling of Voids". This application and the other applications, patents, and publications set forth herein are each incorporated herein by reference as if set forth in full.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A probe device for testing integrated circuits, comprising:
   a conductive bridging element;
   a plurality of conductive contact arms, each having a first end and a second end, where the second end of each connects to the bridging element and the first end of each is configured to contact a common pad of an integrated circuit and wherein the arms are configured to cause at least one of the first ends to scrub a surface of the pad relative to at least another one of the first ends as contact between the first ends and the pad is made; and
   at least one pushing element that causes the arms to separate as each of the first ends is mated to a pad.

2. The probe of claim 1 wherein a relative movement between the bridging element of the probe device and the pad of the integrated circuit is substantially perpendicular to a plane of the pad.

3. The probe of claim 1 wherein the plurality of the contact arms have an outward taper.

4. The probe of claim 1 wherein the plurality of the contact arms have an inward taper.

5. The probe of claim 1 wherein the second end of each arm comprises a compliant member.

6. The probe of claim 5 wherein the compliant member provides compliance in a direction parallel to a direction of relative movement between the pad and the bridging element.

7. The probe of claim 1 wherein the bridging element comprises a compliant member.

8. The probe of claim 7 wherein the compliant member provides compliance in a direction parallel to a direction of relative movement between the pad and the bridging element.

9. The probe of claim 7 wherein the compliant member is located adjacent the plurality of arms.

10. The probe of claim 7 wherein the compliant member is located away from a location where the second end of the arms contact the bridging element.

11. The probe of claim 1 wherein the pushing element operates as a result of a contact between the first end and the pad as the pad and the first end are brought into contact.

12. The probe of claim 1 wherein the pushing element is controlled to operate independently of a movement of the contact arms and the pad.

13. A probe device for testing integrated circuits, comprising:
   a conductive bridging element;
   a plurality of conductive contact arms, each having a first end and a second end, where the second end of each connects to the bridging element and the first end of each is configured to contact a common pad of an integrated circuit and wherein the arms are configured to cause at least one of the first ends to scrub a surface of the pad relative to a least another one of the first ends as contact between the first ends and the pad is made; and.
   at least one pulling element that causes the arms to come together as each of the first ends is mated to the pad.

14. The probe of claim 1 wherein the plurality of contact arms are formed from a plurality of adhered layers of deposited material.

15. The probe of claim 7 wherein the compliant member is formed from a plurality of adhered layers of material.

16. A probe device for testing integrated circuits, comprising:
   a conductive bridging element;
   a plurality of conductive contact arms, each having a first end and a second end, where the second end of each connects to the bridging element and the first end of each is configured to contact a common pad of an integrated circuit and wherein multiple arms of the plurality of arms are configured to provide compliance between the probe device and the pad as contact between the plurality of contact arms and the pad is made; and
   at least one pushing element that causes the arms to separate as each of the first ends is mated to the pad.

17. The probe of claim 16 wherein a relative movement between the bridging element of the probe device and the pad of the integrated circuit is substantially perpendicular to a plane of the pad.

18. The probe of claim 16 wherein the plurality of the contact arms have an outward taper.

19. The probe of claim 16 wherein the plurality of the contact arms have an inward taper.

20. The probe of claim 16 additionally wherein the second end of each arm comprises a compliant member.

21. The probe of claim 20 wherein the compliant member provides compliance in a direction parallel to a direction of relative movement between the pad and the bridging element.

22. The probe of claim 16 wherein the bridging element comprises a compliant member.

23. The probe of claim 22 wherein the compliant member provides compliance in a direction parallel to a direction of relative movement between the pad and the bridging element.

24. The probe of claim 22 wherein the compliant member is located adjacent the plurality of arms.

25. The probe of claim 22 wherein the compliant member is located away from a location where the second end of the arms contact the bridging element.

26. The probe of claim 16 wherein the pushing element operates as a result of a contact between the first end and the pad as the pad and the first end are brought into contact.

27. The probe of claim 16 wherein the pushing element is controlled to operate independently of a movement of the contact arms and the pad.

28. A probe device for testing integrated circuits, comprising:
   a conductive bridging element;
   a plurality of conductive contact arms, each having a first end and a second end, where the second end of each connects to the bridging element and the first end of each is configured to contact a common pad of an integrated circuit and wherein multiple arms of the plurality of arms are configured to provide compliance between the probe device and the pad as contact between the plurality of contact arms and the pad is made; and
   at least one pulling element that causes the arms to come together as each of the first ends is mated to the pad.

29. The probe of claim 16 wherein the plurality of contact arms are formed from a plurality of adhered layers of deposited material.

30. The probe device of claim 1 incorporated into an array of probe devices with a plurality of probe devices each comprising a conductive bridging element and a plurality of conductive arms where each of the plurality of probe devices is adhered to a substrate.

31. The probe device of claim 16 incorporated into an array of probe devices with a plurality of probe devices each comprising a conductive bridging element and a plurality of conductive arms where each of the plurality of probe devices is adhered to a substrate.

* * * * *